US012635586B2

(12) United States Patent
Hsieh et al.

(10) Patent No.: US 12,635,586 B2
(45) Date of Patent: May 19, 2026

(54) SEMICONDUCTOR PACKAGE

(71) Applicant: CHIPBOND TECHNOLOGY CORPORATION, Hsinchu (TW)

(72) Inventors: Chin-Tang Hsieh, Kaohsiung City (TW); Lung-Hua Ho, Hsinchu City (TW); Chih-Ming Kuo, Hsinchu County (TW); Chen-Yu Wang, Hsinchu City (TW); Chih-Hao Chiang, Hsinchu County (TW); Pai-Sheng Cheng, Hsinchu City (TW); Kung-An Lin, Hsinchu City (TW); Chun-Ting Kuo, Kaohsiung City (TW); Yu-Hui Hu, Pingtung County (TW); Wen-Cheng Hsu, Hsinchu County (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 369 days.

(21) Appl. No.: 18/374,725

(22) Filed: Sep. 29, 2023

(65) Prior Publication Data

US 2024/0194646 A1    Jun. 13, 2024

(30) Foreign Application Priority Data

Dec. 9, 2022    (TW) .................................. 111147496

(51) Int. Cl.
H10W 90/00        (2026.01)
H10W 42/20        (2026.01)
(Continued)

(52) U.S. Cl.
CPC ........... H10W 90/00 (2026.01); H10W 42/20 (2026.01); H10W 70/685 (2026.01);
(Continued)

(58) Field of Classification Search
CPC ......... H01L 2924/3511; H01L 25/0652; H01L 25/0657; H01L 24/13; H01L 24/16;
(Continued)

(56) References Cited

U.S. PATENT DOCUMENTS

2017/0062383 A1    3/2017  Yee et al.
2017/0207197 A1*   7/2017  Yu .......................... H10W 90/00
(Continued)

FOREIGN PATENT DOCUMENTS

CN        111106096  A    5/2020
JP        2009-176931 A    8/2009
(Continued)

OTHER PUBLICATIONS

Taiwanese Office Action mailed Oct. 16, 2023 for Taiwanese Patent Application No. 111147496, 5 pages.
(Continued)

*Primary Examiner* — Vongsavanh Sengdara
(74) *Attorney, Agent, or Firm* — Demian K. Jackson; Jackson IPG PLLC

(57)        ABSTRACT

A semiconductor package includes a substrate, first bumps, a first chip, metal pillars, second bumps and a second chip. The substrate includes first and second conductive pads which are located on a top surface of the substrate. Both ends of the first bumps are connected to the first conductive pads and the first chip, respectively. Both ends of the metal pillars are connected to the second conductive pads and one end of the second bumps, respectively. A cross-sectional area of each of the metal pillars is larger than that of each of the second bumps. The second chip is connected to the other end of the second bumps and located above the first chip.

11 Claims, 7 Drawing Sheets

<u>100</u>

(51) Int. Cl.

| | |
|---|---|
| *H10W 70/685* | (2026.01) |
| *H10W 72/20* | (2026.01) |
| *H10W 74/10* | (2026.01) |

(52) U.S. Cl.
CPC ........ *H10W 74/111* (2026.01); *H10W 72/223* (2026.01); *H10W 90/724* (2026.01)

(58) Field of Classification Search
CPC . H01L 24/81; H01L 23/3107; H01L 23/3128; H01L 23/49816; H01L 23/49822; H01L 23/552; H01L 2225/06517; H01L 2224/13541; H01L 2224/16227; H01L 2224/16238
See application file for complete search history.

(56) References Cited

U.S. PATENT DOCUMENTS

| | | | | |
|---|---|---|---|---|
| 2018/0286816 A1* | 10/2018 | Kitazaki | ............... | H10W 42/20 |
| 2019/0164938 A1* | 5/2019 | Lee | ....................... | H10W 70/68 |
| 2020/0211979 A1* | 7/2020 | Hsieh | ................... | H10W 42/20 |
| 2020/0312782 A1* | 10/2020 | Eid | ........................ | H10W 42/20 |
| 2021/0134733 A1* | 5/2021 | Tarui | ..................... | H10W 42/20 |
| 2024/0006337 A1* | 1/2024 | Yoshida | ................ | H10W 42/20 |

FOREIGN PATENT DOCUMENTS

| | | |
|---|---|---|
| JP | 2011-054652 A | 3/2011 |
| JP | 2011-211023 A | 10/2011 |
| JP | 2022-016372 A | 1/2022 |
| KR | 10-2013-0077033 A | 7/2013 |
| KR | 10-2019-0074193 A | 6/2019 |
| KR | 10-2021-0158508 A | 12/2021 |
| TW | 202125732 A | 7/2021 |
| TW | 202203403 A | 1/2022 |
| TW | 202247392 A | 12/2022 |
| WO | 2021/140850 A1 | 7/2021 |

OTHER PUBLICATIONS

Korean office action mailed Jan. 8, 2025 for Korean patent application No. 10-2023-0161906, 7 pages.
Japanese office action mailed Dec. 20, 2024 for Japanese patent application No. 2023-199110, 8 pages.

* cited by examiner

100

170 150 140 120 180 130 120 160 150 140

110 114 115 117 115 116 190 113 116 112 114 111 117

150 140

SEMICONDUCTOR PACKAGE

FIELD OF THE INVENTION

This invention relates to a semiconductor package, and more particularly to a semiconductor package having chip stack.

BACKGROUND OF THE INVENTION

With massive use of wearable devices, IC size reduction is necessary and meanwhile faster computing speed. It is difficult to increase the number of transistors in a single chip, thus chip stack package technology is recently promoted to increase IC computing speed in semiconductor industry. Two or more chips are 3D-stacked using bumps in a single semiconductor package with size limitation to enhance overall performance. Taller bumps are required to separate two chips in chip stack package in order to prevent warpage or ineffective heat dissipation due to stacked chips. However, taller bump manufacture is more difficult and higher cost.

SUMMARY

One object of the present invention is to place a second chip over a first chip using metal pillars to obtain a chip stack package and reduce process complexity and overall cost effectively.

A semiconductor package of the present invention includes a substrate, first bumps, a first chip, metal pillars, second bumps and a second chip. The substrate includes a top surface, first conductive pads and second conductive pads, and the first and second conductive pads are located on the top surface. One end of each of the first bumps is connected to one of the first conductive pads, the first chip is connected to the other end of each of the first bumps, one end of each of the metal pillars is connected to one of the second conductive pads, and one end of each of the second bumps is connected to the other end of one of the metal pillars. A cross-sectional area of each of the metal pillars is larger than that of each of the second bumps. The second chip is connected to the other end of each of the second bumps and located over the first chip.

In the present invention, the second chip can be placed over the first chip by two-part configuration of the metal pillars and the second bumps to obtain a chip stack package. Owing to the second chip is supported by the two-part configuration, process complexity reduction and yield improvement are feasible.

DETAILED DESCRIPTION OF THE INVENTION

Figure 1:
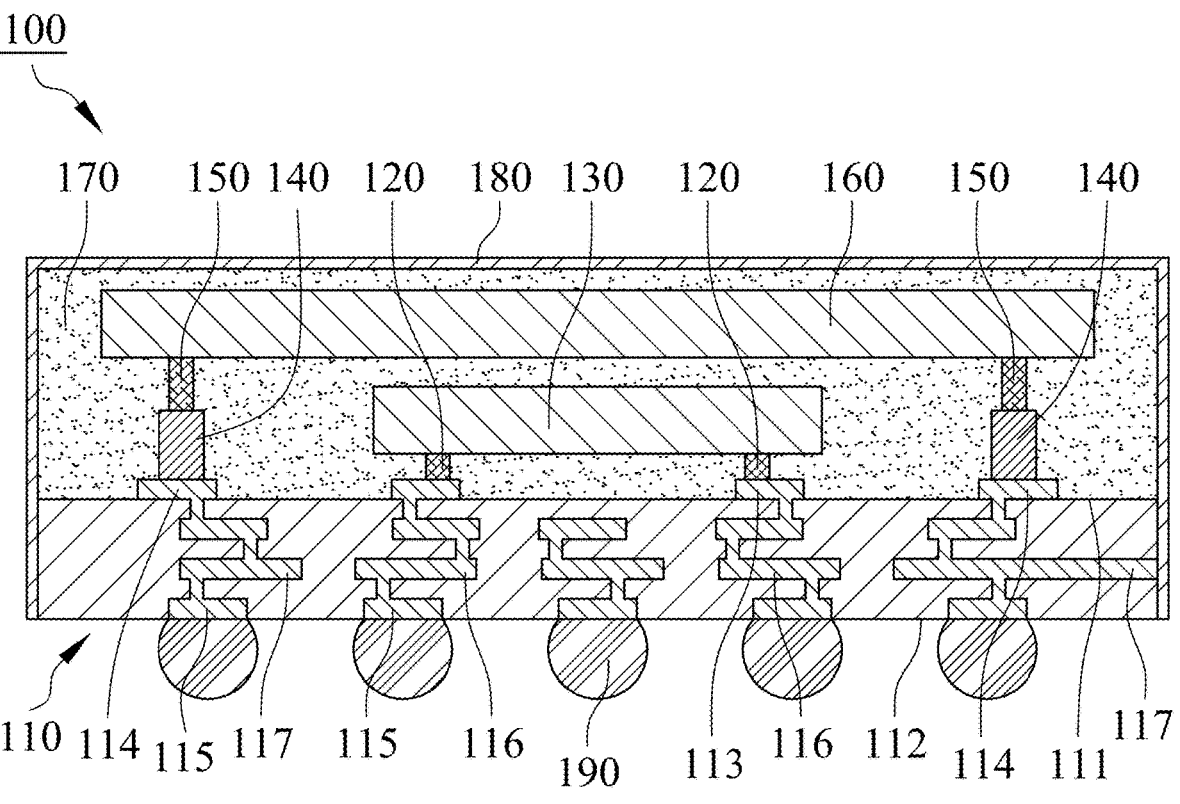
FIG. 1 is a cross-section view diagram illustrating a semiconductor package in accordance with a first embodiment of the present invention.

With reference to FIG. 1, a semiconductor package 100 in accordance with a first embodiment of the present invention includes a substrate 110, a plurality of first bumps 120, a first chip 130, a plurality of metal pillars 140, a plurality of second bumps 150, a second chip 160 and an encapsulation layer 170.

In the first embodiment, the substrate 110 is a redistribution layer (RDL) including a top surface 111, a bottom surface 112, a plurality of first conductive pads 113, a plurality of second conductive pads 114 and a plurality of third conductive pads 115. The first conductive pads 113 and the second conductive pads 114 are located on the top surface 111, and the third conductive pads 115 are located on the bottom surface 112. Preferably, the substrate 110 is composed of dielectric material and a plurality of metal layers.

The metal layers in the substrate 110 involves a plurality of first circuit layers 116 and a plurality of second circuit layers 117. Each of the first circuit layers 116 is electrically connected to one of the first conductive pads 113 and one of the third conductive pads 115 for providing electrical connection between the first conductive pads 113 and the third conductive pads 115. Each of the second circuit layers 117 is electrically connected to one of the second conductive pads 114 and one of the third conductive pads 115 such that the second conductive pads 114 and the third conductive pads 115 are electrically connected with each other. The semiconductor package 100 can be connected to other circuit board (not shown) through solder balls 190 which each is provided on one of the third conductive pads 115. In the first embodiment, positions of the first conductive pads 113 and the second conductive pads 114 can be modified for different circuit layout because of the third conductive pads 115, the first circuit layers 116 and the second circuit layers 117. The substrate 110 is not limited to RDL in the present invention, it may be IC circuit board in other embodiments.

Referring to FIG. 1 again, one end of each of the first bumps 120 is connected to one of the first conductive pads 113, and the other end of each of the first bumps 120 is connected to the first chip 130. The first chip 130 is flip-chip bonded to the first conductive pads 113 of the substrate 110 by the first bumps 120 which are formed on the first chip 130 by patterning process. The first bumps 120 can be made of copper, copper alloy, nickel, gold or other metal or alloy.

One end of each of the metal pillars 140 is connected to one of the second conductive pads 114. Preferably, the metal pillars 140 are made in advance and then mounted on the second conductive pads 114 one to one. In other embodiments, the metal pillars 140 are formed on the corresponding second conductive pads 114 through exposure, development and electroplating processes. One end of each of the second bumps 150 is connected to the other end of one of the metal pillars 140, and the other end of each of the second bumps 150 is connected to the second chip 160. The second bumps 150 are formed on the second chip 160 by patterning process, and the second chip 160 is flip mounted onto the metal pillars 140 using the second bumps 150. The second bumps 150 can be made of copper, copper alloy, nickel, gold or other metal or alloy.

The position of the second chip 160 is elevated by two-part configuration, the metal pillars 140 and the second bumps 150, in the first embodiment, thus the second chip 160 can be located above the first chip 130 easily. And it is available to further reduce manufacture complexity of the semiconductor package 100 while the metal pillars 140 are made in advance, not directly formed on the second conductive pads 114 through exposure, development and electroplating processes.

Figure 2:
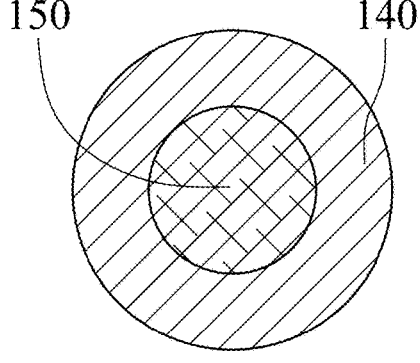
FIG. 2 is a cross-section view diagram illustrating a connection between a metal pillar and a second bump in accordance with the first embodiment of the present invention.

Referring to FIGS. 1 and 2, FIG. 2 is a cross section view diagram showing the connection between each of the metal pillars 140 and the corresponding second bump 150. Preferably, a cross-sectional area of each of the metal pillars 140 is larger than that of each of the second bumps 150 such that the second bumps 150 on the second chip 160 can be aligned with the metal pillars 140 more easily and precisely during flip-chip bonding process of the second chip 160. In the first embodiment, the cross-sectional area ratio of each of the second bumps 150 to each of the metal pillars 140 is between 1:1 and 1:3.

Figure 3:
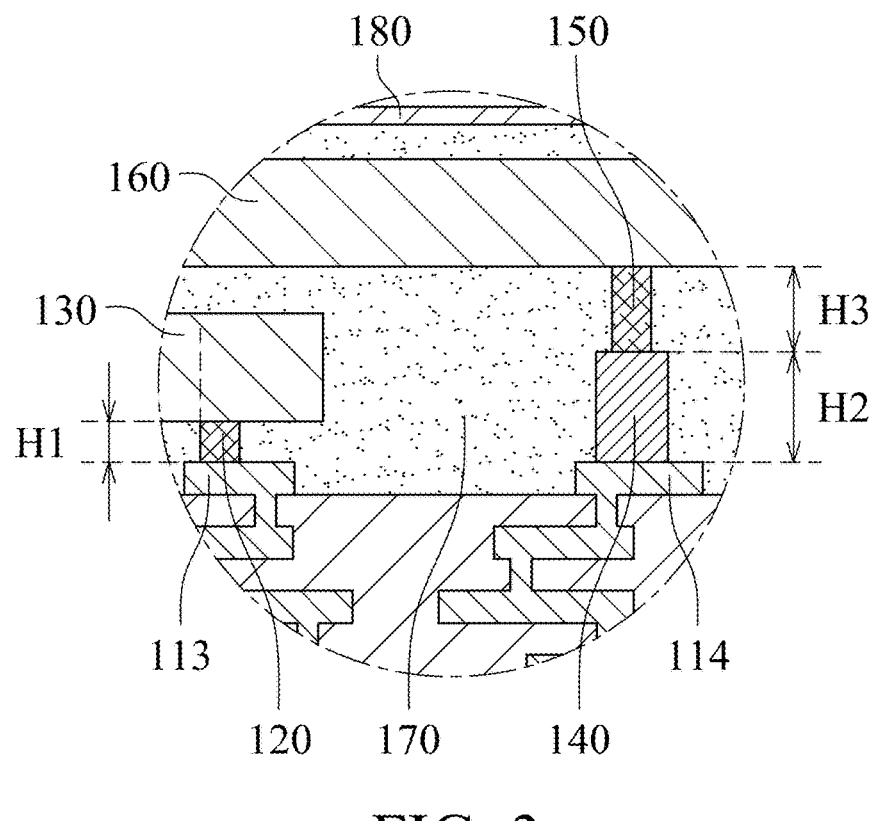
FIG. 3 is an enlarged cross-section view diagram illustrating a part of the semiconductor package in accordance with the first embodiment of the present invention.

With reference to FIG. 3, preferably, a height H2 of each of the metal pillars 140 is designed to be greater than a height H1 of each of the first bumps 120, so the second chip 160 can be placed over the first chip 130 easily. In the first embodiment, the ratio of the height H1 of each of the first bumps 120 to the height H2 of each of the metal pillars 140 is within the range between 1:1 to 1:5.

With reference to FIG. 1, the encapsulation layer 170, which can be made of epoxy molding compound (EMC), is provided on the top surface 111 of the substrate 110 to cover the first bumps 120, the first chip 130, the metal pillars 140, the second bumps 150 and the second chip 160 for insulation and moisture resistance. Furthermore, in order to reduce electromagnetic interference (EMI) between the components in the semiconductor package 100 and the nearby chip, an electromagnetic shielding layer 180 is further provided to cover the encapsulation layer 170 and the substrate 110 in the first embodiment. The electromagnetic shielding layer 180 is made of a metallic material and have a larger area to be used as ground layer of the semiconductor package 100. Preferably, one of the second circuit layers 117 is electrically connected to the electromagnetic shielding layer 180 so as to allow the second conductive pad 114 and the third conductive pad 115 to be connected to ground via the second circuit layer 117 and the electromagnetic shielding layer 180.

Figure 4:
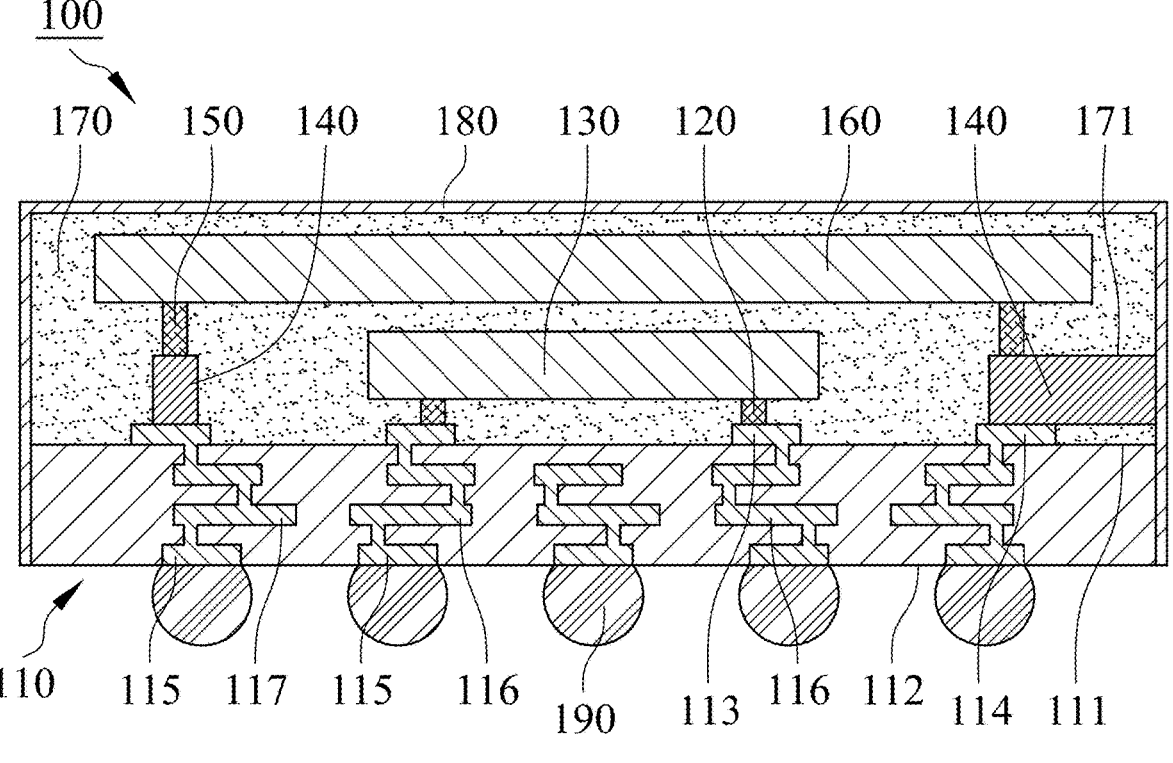
FIG. 4 is a cross-section view diagram illustrating a semiconductor package in accordance with a second embodiment of the present invention.

A second embodiment of the present invention is shown in FIG. 4. The difference between the first and second embodiments is that the encapsulation layer 170 of the second embodiment has a hole 171. Because of the hole 171, a lateral surface of one of the metal pillars 140 is visible outside the encapsulation layer 170, and the exposed metal pillar 140 is connected to the electromagnetic shielding layer 180. Owing to the height of the metal pillar 140 is greater than the thickness of the first circuit layer 116, the lateral surface of the metal pillar 140 connected to the electromagnetic shielding layer 180 has a bigger area for better grounding effect.

Furthermore, the metal pillars 140 of the second embodiment have larger area so they can provide better support for the second chip 160 and the second bumps 150 to prevent warpage of the second chip 160 during flip chip process.

Figure 5:
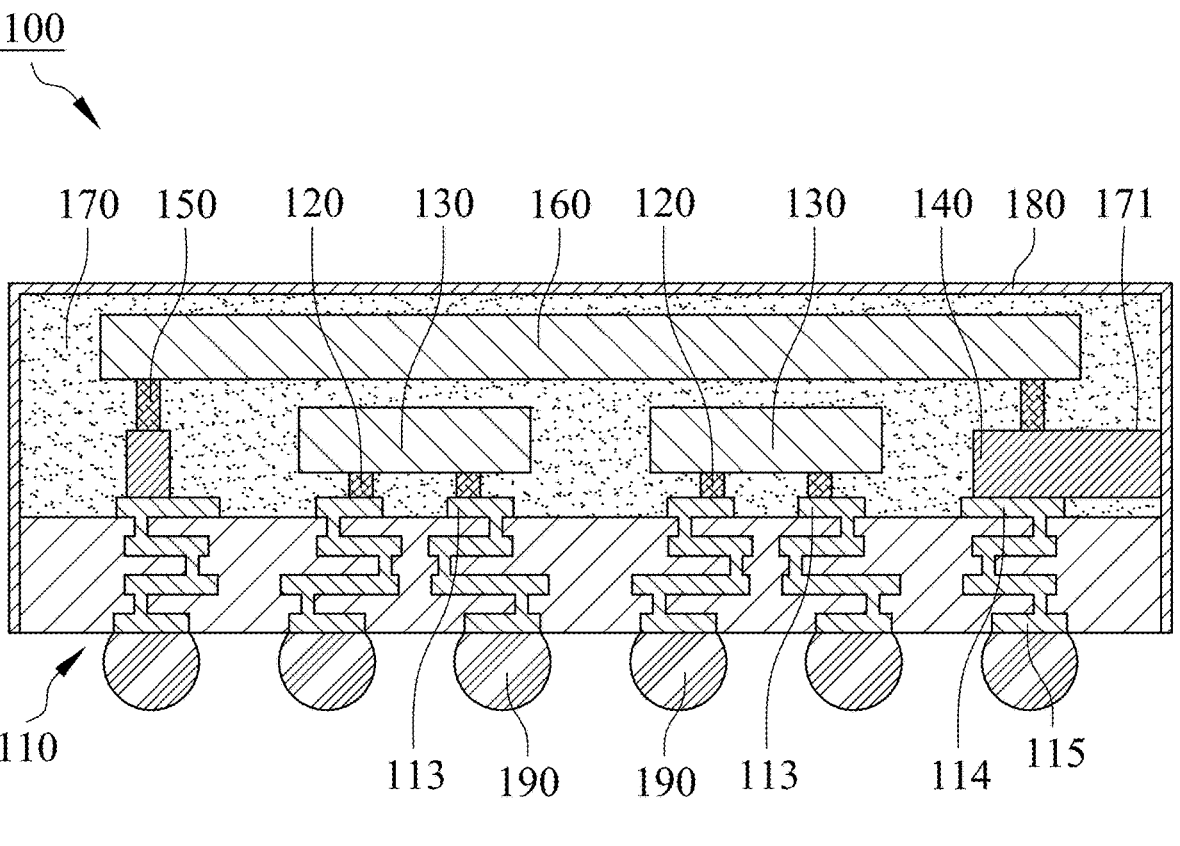
FIG. 5 is a cross-section view diagram illustrating a semiconductor package in accordance with a third embodiment of the present invention.

With reference to FIG. 5, it shows a third embodiment of the present invention. Different to the second embodiment, the semiconductor package 100 of the third embodiment includes a plurality of first chips 130. Each of the first chips 130 is connected to the other end of the first bumps 120 and located under the second chip 160. Because the metal pillar 140 connected to the electromagnetic shielding layer 180 via the hole 171 has a larger area in the third embodiment, the larger metal pillar 140 can provide greater support for the second chip 160 and the second bumps 150, and the second chip 160 can be designed to be wider to let the space beneath the second chip 160 have enough space for the two first chips 130. Consequently, it is able to increase processing speed of single semiconductor package 100.

Figure 6:
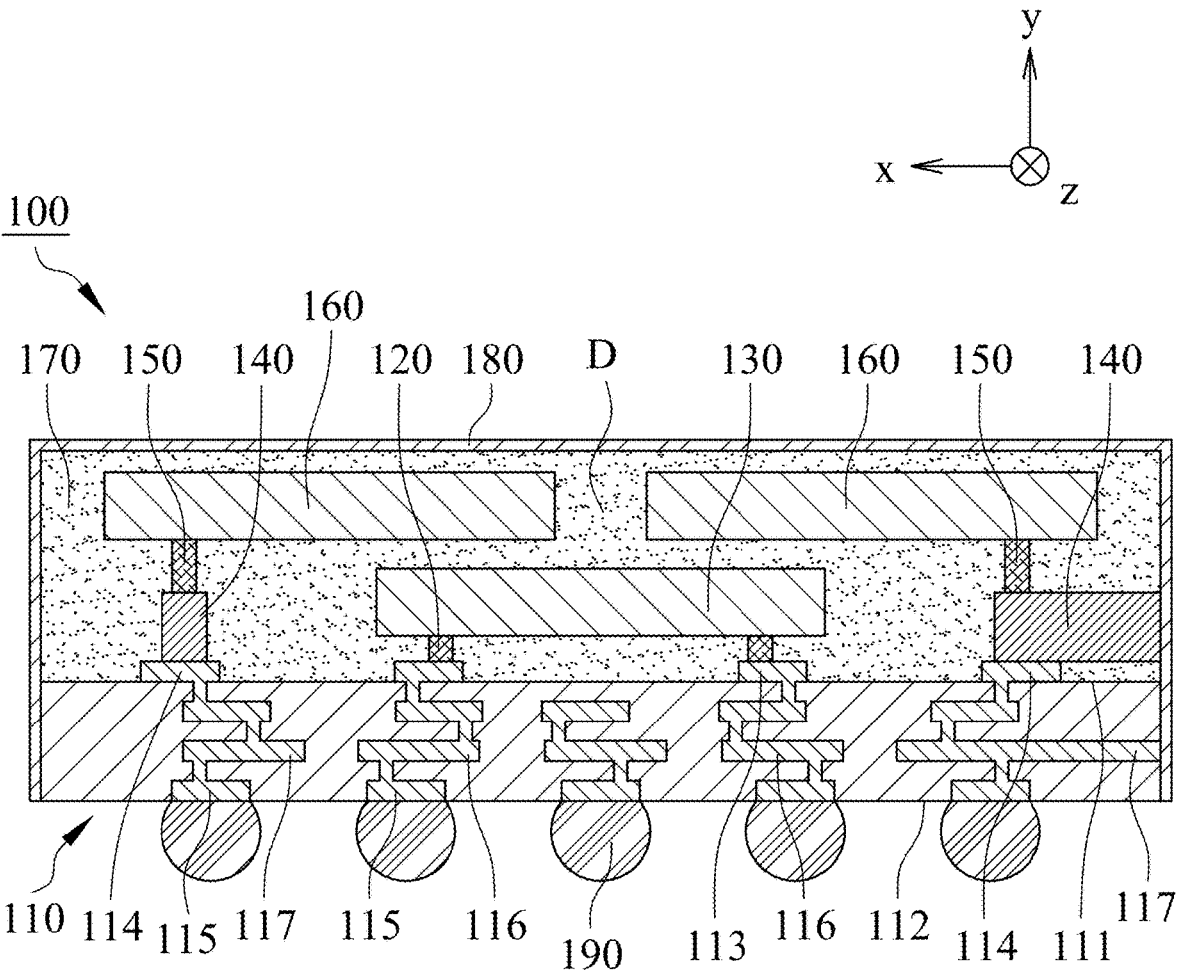
FIG. 6 is a cross-section view diagram illustrating a semiconductor package in accordance with a fourth embodiment of the present invention.
Figure 7:
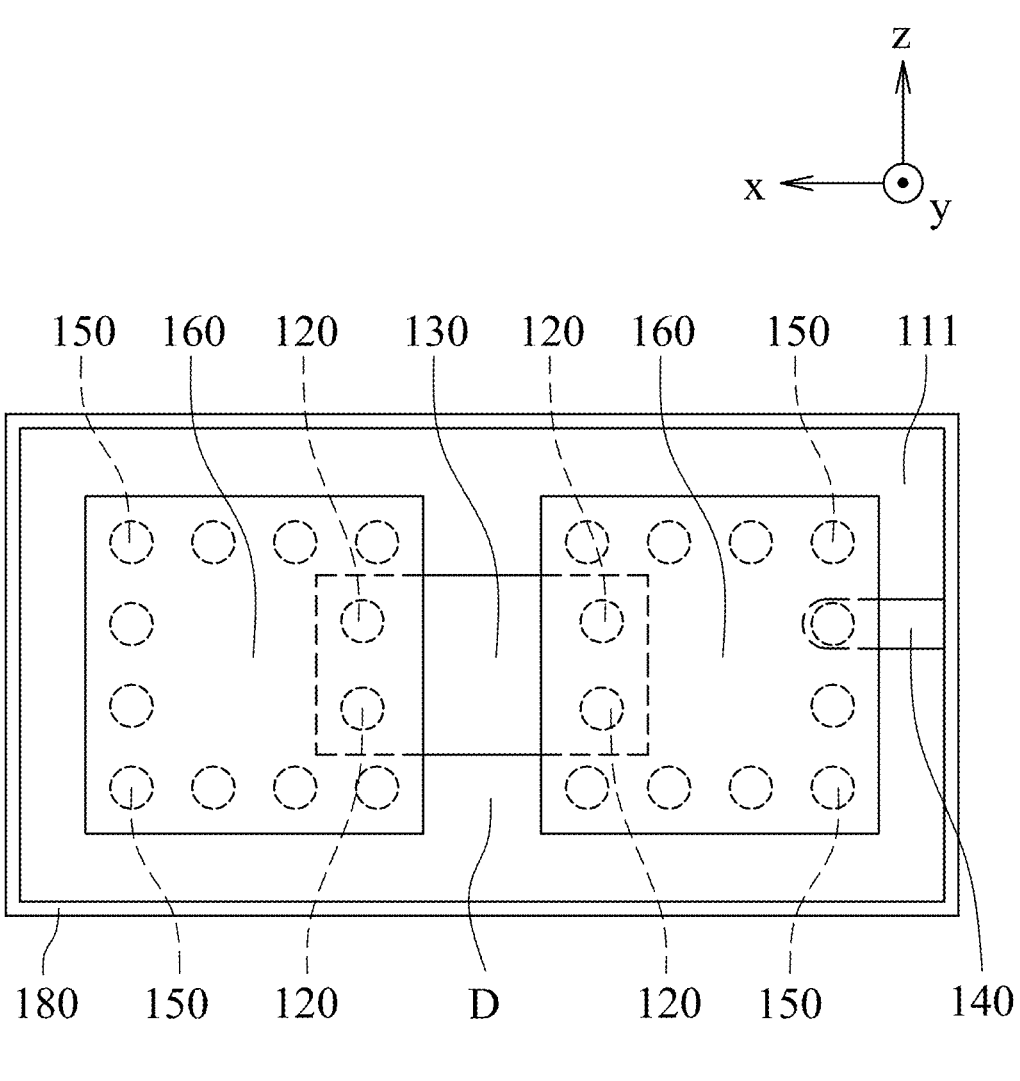
FIG. 7 is a top view diagram illustrating the semiconductor package in accordance with the fourth embodiment of the present invention.

FIGS. 6 and 7 are provided to illustrate a fourth embodiment of the present invention. The difference between the first and fourth embodiments is there are a plurality of second chips 160 in the semiconductor package 100 of the fourth embodiment. Each of the second chips 160 is connected to the other end of one the second bumps 150 and located above the first chip 130. A gap D exists between the two adjacent second chips 160 to expose a backside of the first chip 130. Because of the multiple second chips 160, packing density of the semiconductor package 100 can further be increased for effectiveness improvement.

Figure 8:
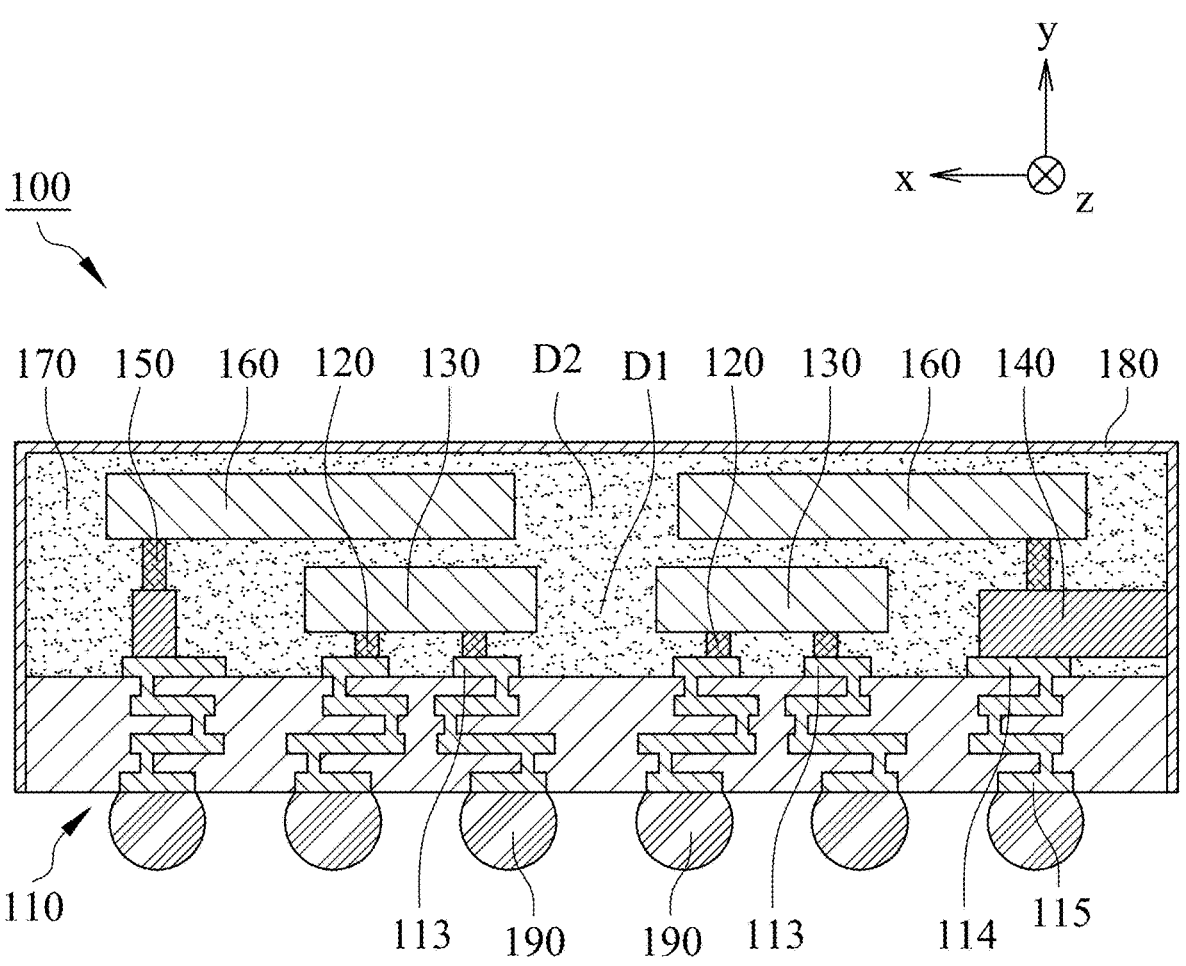
FIG. 8 is a cross-section view diagram illustrating a semiconductor package in accordance with a fifth embodiment of the present invention.
Figure 9:
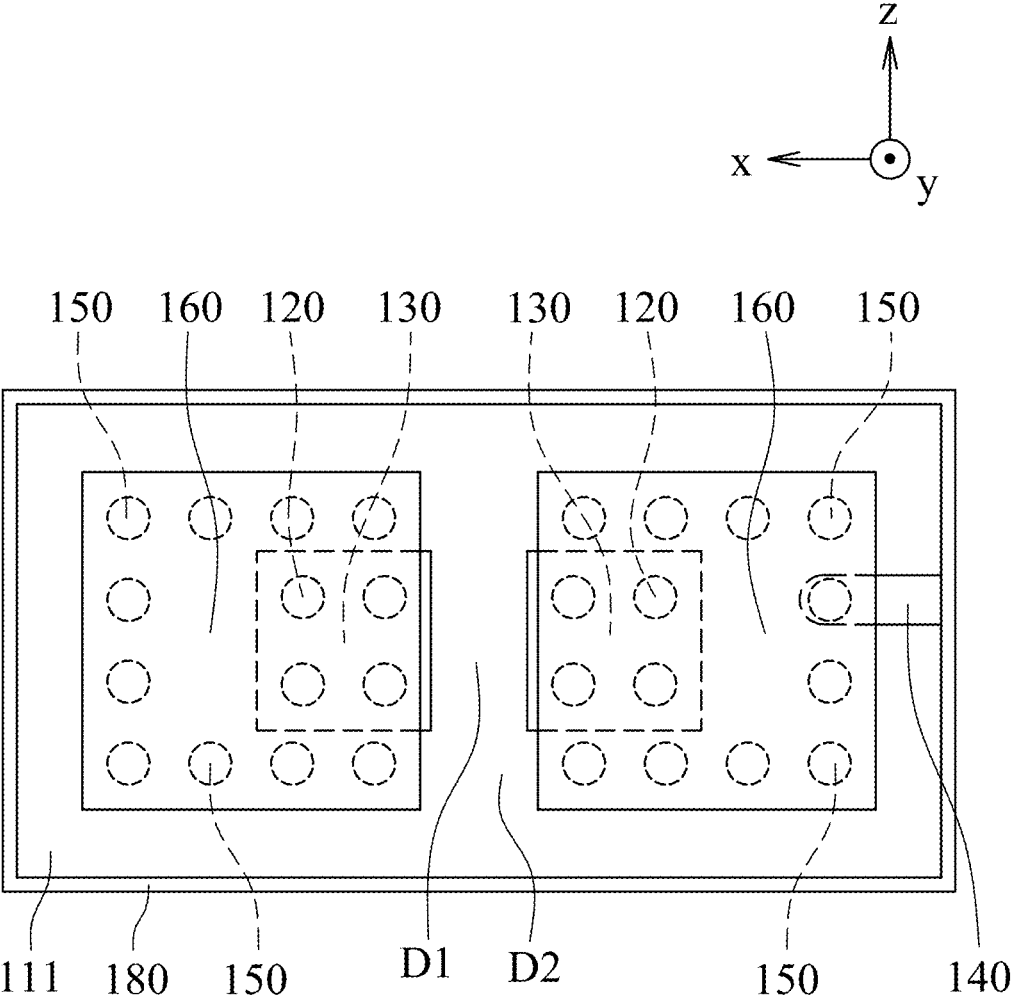
FIG. 9 is a top view diagram illustrating the semiconductor package in accordance with the fifth embodiment of the present invention.

A fifth embodiment of the present invention is shown in FIGS. 8 and 9. Different to the fourth embodiment, there are a plurality of first chips 130 in the semiconductor package 100 of the fifth embodiment. Each of the first chips 130 is connected to the other end of the first bumps 120 and located below the second chips 160. There is a first gap D1 between the two adjacent first chips 130 and a second gap D2 between the two adjacent second chips 160, and the second gap D2 is located over the first gap D1. Packing density of the semiconductor package 100 of the fifth embodiment can be increased to enhance effectiveness by the multiple first chips 130 and the multiple second chips 160.

The second chip 160 of the present invention is raised up using the metal pillars 140 and the second bumps 150 such that the first chip 130 can be mounted under the second chip 160 to get a semiconductor package 100 with chip stack. Because the second chip 160 is supported by a two-part configuration, process complexity reduction and yield improvement are available.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A semiconductor package comprising:
   a substrate including a top surface, a plurality of first conductive pads and a plurality of second conductive pads, the plurality of first and second conductive pads are located on the top surface;
   a plurality of first bumps, one end of each of the plurality of first bumps is connected to one of the plurality of first conductive pads;

a first chip connected to the other end of each of the plurality of first bumps;

a plurality of metal pillars, one end of each of the plurality of metal pillars is connected to one of the plurality of second conductive pads;

a plurality of second bumps, one end of each of the plurality of second bumps is connected to the other end of one of the plurality of metal pillars, wherein a cross-sectional area of each of the plurality of metal pillars is larger than a cross-sectional area of each of the plurality of second bumps; a second chip connected to the other end of each of the plurality of second bumps and located above the first chip;

an encapsulation layer provided on the top surface of the substrate, wherein the plurality of first bumps, the first chip, the plurality of metal pillars, the plurality of second bumps, and the second chip are covered by the encapsulation layer; and an electromagnetic shielding layer arranged to cover the encapsulation layer and the substrate and wherein a lateral surface of one of the plurality of metal pillars is electrically connected to the electromagnetic shielding layer.

2. The semiconductor package in accordance with claim 1, wherein one of the plurality of metal pillars is exposed through a hole on the encapsulation layer and connected to the electromagnetic shielding layer.

3. The semiconductor package in accordance with claim 2, wherein the substrate is a redistribution layer including a plurality of first circuit layers and a plurality of second circuit layers, each of the plurality of first circuit layers is electrically connected to one of the plurality of first conductive pads, each of the plurality of second circuit layers is electrically connected to one of the plurality of second conductive pads, and one of the plurality of second circuit layers is electrically connected to the electromagnetic shielding layer.

4. The semiconductor package in accordance with claim 1 comprising a plurality of first chips, wherein each of the plurality of first chips is connected to the other end of the plurality of first bumps and located under the second chip.

5. The semiconductor package in accordance with claim 1, wherein a cross-sectional area ratio of each of the plurality of second bumps to each of the plurality of metal pillars is from 1:1 to 1:3.

6. The semiconductor package in accordance with claim 1, wherein a height of each of the plurality of metal pillars is higher than a height of each of the plurality of first bumps.

7. The semiconductor package in accordance with claim 6, wherein a ratio of the height of each of the plurality of first bumps to the height of each of the plurality of metal pillars is from 1:1 to 1:5.

8. The semiconductor package in accordance with claim 1 comprising a plurality of second chips, wherein each of the plurality of second chips is connected to the other end of the plurality of second bumps and located above the first chip.

9. The semiconductor package in accordance with claim 8, wherein a backside of the first chip is exposed by a gap located between the two adjacent second chips.

10. The semiconductor package in accordance with claim 8 comprising a plurality of first chips, wherein each of the plurality of first chips is connected to the other end of one of the plurality of first bumps and located under the plurality of second chips.

11. The semiconductor package in accordance with claim 10, wherein there is a first gap between the two adjacent first chips and a second gap between the two adjacent second chips, and the second gap is located above the first gap.

* * * * *